(12) United States Patent
Goh et al.

(10) Patent No.: US 12,260,158 B2
(45) Date of Patent: Mar. 25, 2025

(54) FLOW CONTROL DEVICE OPENINGS FOR COMPLETION DESIGN

(71) Applicant: Schlumberger Technology Corporation, Sugar Land, TX (US)

(72) Inventors: Kim Fah Goh, Pune (IN); Trevor Tonkin, Abingdon (GB); Mohamed Osman Mahgoub Ahmed, Abingdon (GB); Matthew Worthington, Houston, TX (US)

(73) Assignee: SCHLUMBERGER TECHNOLOGY CORPORATION, Sugar Land, TX (US)

( * ) Notice: Subject to any disclaimer, the term of this patent is extended or adjusted under 35 U.S.C. 154(b) by 562 days.

(21) Appl. No.: 17/595,939

(22) PCT Filed: Jun. 3, 2019

(86) PCT No.: PCT/US2019/035171
§ 371 (c)(1),
(2) Date: Nov. 30, 2021

(87) PCT Pub. No.: WO2020/246954
PCT Pub. Date: Dec. 10, 2020

(65) Prior Publication Data
US 2022/0229403 A1 Jul. 21, 2022

(51) Int. Cl.
*G06F 30/27* (2020.01)
*E21B 43/00* (2006.01)
(Continued)

(52) U.S. Cl.
CPC ............. *G06F 30/20* (2020.01); *E21B 43/00* (2013.01); *E21B 43/12* (2013.01); *E21B 43/14* (2013.01);
(Continued)

(58) Field of Classification Search
CPC .......... G06F 30/20; G06F 30/27; E21B 43/00; E21B 43/12; E21B 43/14; E21B 2200/20;
(Continued)

(56) References Cited

U.S. PATENT DOCUMENTS

| 10,450,825 B2 | 10/2019 | Blekhman et al. | |
| 2010/0217575 A1* | 8/2010 | Briers | E21B 43/14 |
| | | | 703/10 |

(Continued)

FOREIGN PATENT DOCUMENTS

WO 2020/242455 A1 12/2020

OTHER PUBLICATIONS

Morais, V. L., A. R. Fioravanti, and D. J. Schiozer. "Methodology to estimate the economic impact of intelligent wells considering reservoir uncertainties." SPE Reservoir Simulation Conference?. SPE, 2017. (Year: 2017).*

(Continued)

*Primary Examiner* — John E Johansen
(74) *Attorney, Agent, or Firm* — Jeffrey D. Frantz

(57) ABSTRACT

Defining flow control device configurable positions include executing a reservoir simulator on a reservoir model to obtain a collection of flow control device settings defined in continuous space. For each number of multiple numbers of clusters, a cluster analysis is individually performed on the collection to obtain a set of flow control device configurable positions. The set includes the number of flow control device configurable positions and its corresponding inflow area or diameter. Performing the cluster analysis across the numbers generates multiple sets for the multiple numbers of clusters. The sets of flow control device configurable positions are compared to obtain a selected set of flow control device configurable positions, which is presented in a completion design.

13 Claims, 8 Drawing Sheets

(51) Int. Cl.

| | | |
|---|---|---|
| *E21B 43/12* | (2006.01) | |
| *E21B 43/14* | (2006.01) | |
| *G01V 20/00* | (2024.01) | |
| *G05B 13/04* | (2006.01) | |
| *G06F 30/20* | (2020.01) | |
| *G01V 99/00* | (2024.01) | |

(52) U.S. Cl.
CPC ........... *G01V 20/00* (2024.01); *G05B 13/041* (2013.01); *G06F 30/27* (2020.01); *E21B 2200/20* (2020.05); *E21B 2200/22* (2020.05); *G01V 99/00* (2013.01); *G01V 2210/61* (2013.01)

(58) Field of Classification Search
CPC .... E21B 2200/22; G01V 20/00; G01V 99/00; G01V 2210/61; G05B 13/041
USPC .......................................................... 703/10
See application file for complete search history.

(56) References Cited

U.S. PATENT DOCUMENTS

| | | | | |
|---|---|---|---|---|
| 2014/0257577 | A1* | 9/2014 | Prange | E21B 43/12 703/2 |
| 2015/0013980 | A1* | 1/2015 | Duphorne | E21B 43/12 166/228 |
| 2016/0170417 | A1* | 6/2016 | Sun, Jr. | E21B 47/13 700/282 |
| 2016/0319627 | A1* | 11/2016 | Blekhman | E21B 33/12 |
| 2017/0336811 | A1 | 11/2017 | Stone et al. | |
| 2018/0240021 | A1* | 8/2018 | Al-Harbi | G06F 30/20 |
| 2018/0285515 | A1* | 10/2018 | Isichei | E21B 47/07 |
| 2020/0102819 | A1 | 4/2020 | Watanabe et al. | |
| 2021/0198985 | A1 | 7/2021 | Tonkin et al. | |

OTHER PUBLICATIONS

Zhao, Qinpei, and Pasi Fränti. "Centroid ratio for a pairwise random swap clustering algorithm." IEEE Transactions on Knowledge and Data Engineering 26.5 (2013): 1090-1101. (Year: 2013).*

Jannise, Ricki, et al. "The Qualification Methodology Behind an Integrated Multizone Frac Pack and Intelligent Completion for the Lower Tertiary." Offshore Technology Conference. OTC, 2017. (Year: 2017).*

Eltaher, Eltazy, et al. "Autonomous flow control device modelling and completion optimisation." Journal of Petroleum Science and Engineering 177 (2019): 995-1009. (Year: 2019).*

Shirangi, Mehrdad G., and Louis J. Durlofsky. "Closed-loop field development under uncertainty by use of optimization with sample validation." SPE Journal 20.05 (2015): 908-922. (Year: 2015).*

Haghighat Sefat, Morteza. Proactive optimisation of intelligent wells under uncertainty. Diss. Heriot-Watt University, 2016. (Year: 2016).*

Zhang, Feng, et al. "A Novel Automatic Phase Selection Device: Design and Optimization." IOP Conference Series: Earth and Environmental Science. vol. 108. No. 3. IOP Publishing, 2018. (Year: 2018).*

Li, Q.-Z. et al., "Statistical prediction of waterflooding performance by K-means clustering and emperical modeling", Petroleum Science, 2022 19(3), 14 pages.

Mehrdad G. Shirangi et al."Closed-Loop Field Development Under Uncertainty by Use of Optimization With Sample Validation", SPE Reservoir Simulation Symposium, Houston, Feb. 23-25, 2015, SPE Journal 2015, p. 1-15.

Morteza Haghighat Sefat: "Proactive Optimisation of Intelligent Wells under Uncertainty", PhD Thesis, Heriott-Watt University, School of energy, Geoscience, Infrastructure and Society, Institute of Petroleum Engineering, Oct. 2016. (210 pages).

International Search Report and Written Opinion of International Patent Application No. PCT/US2019/035171 (11 pages).

* cited by examiner

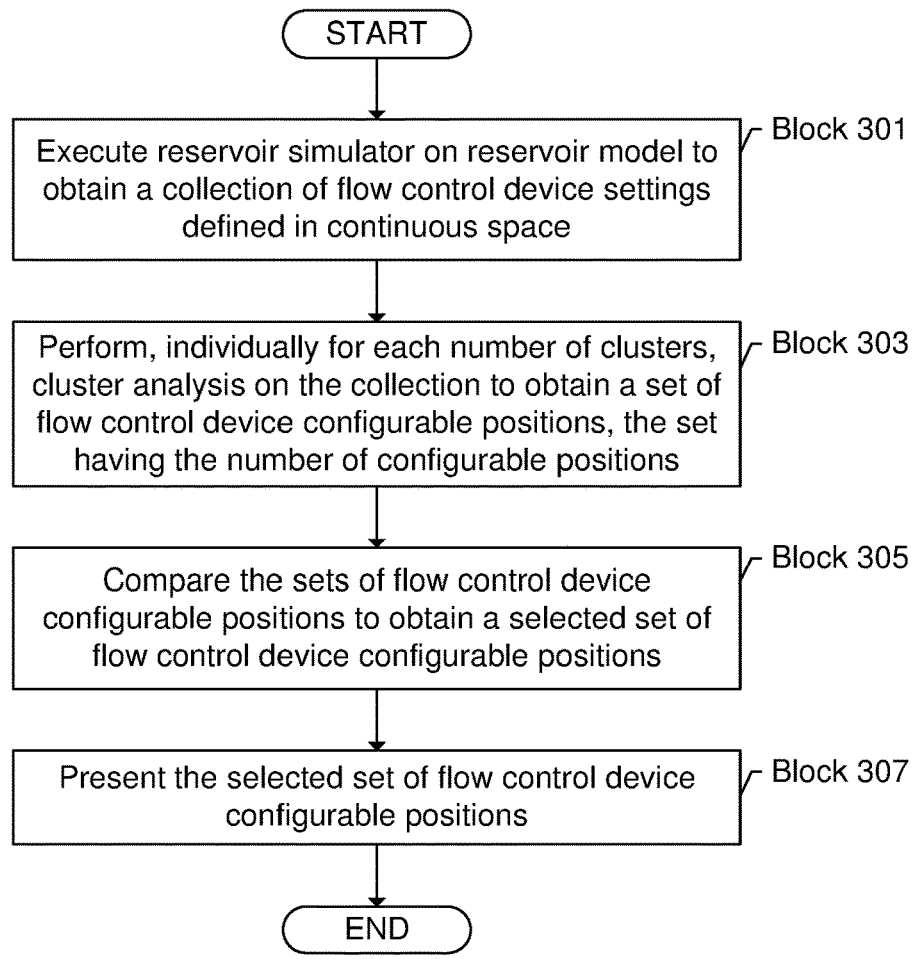
FIG. 3.1
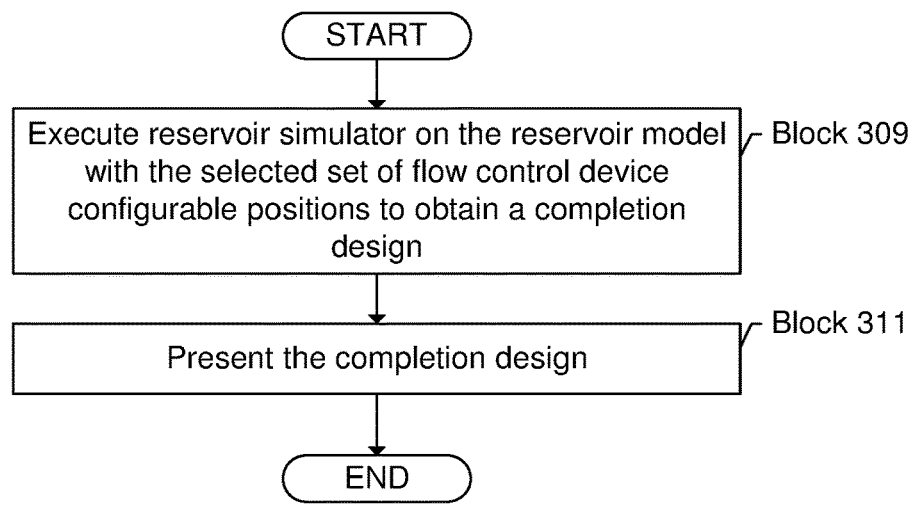
FIG. 3.2

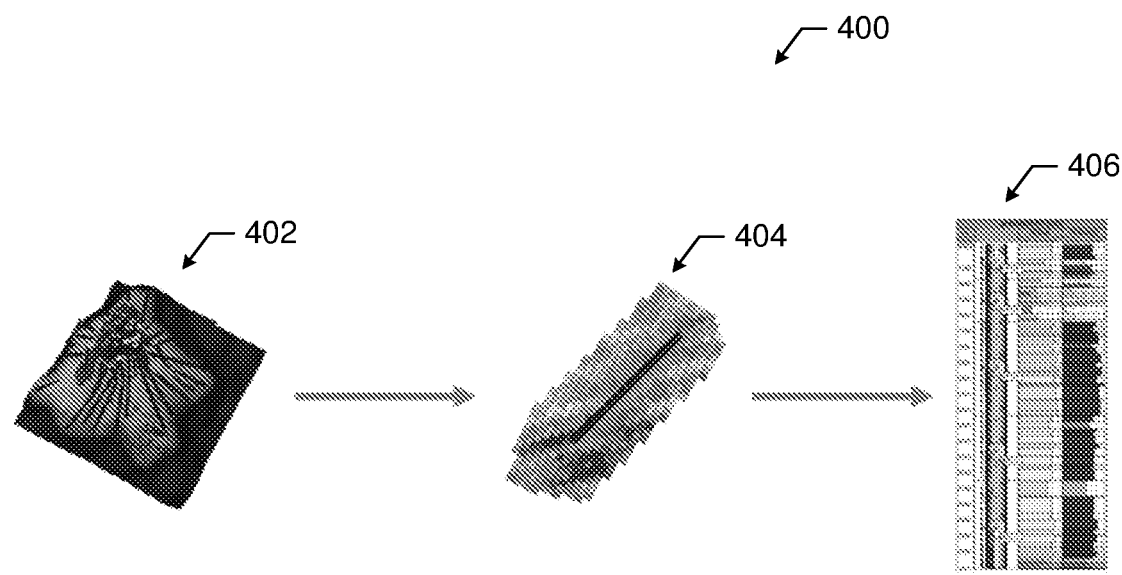
*FIG. 4.1*
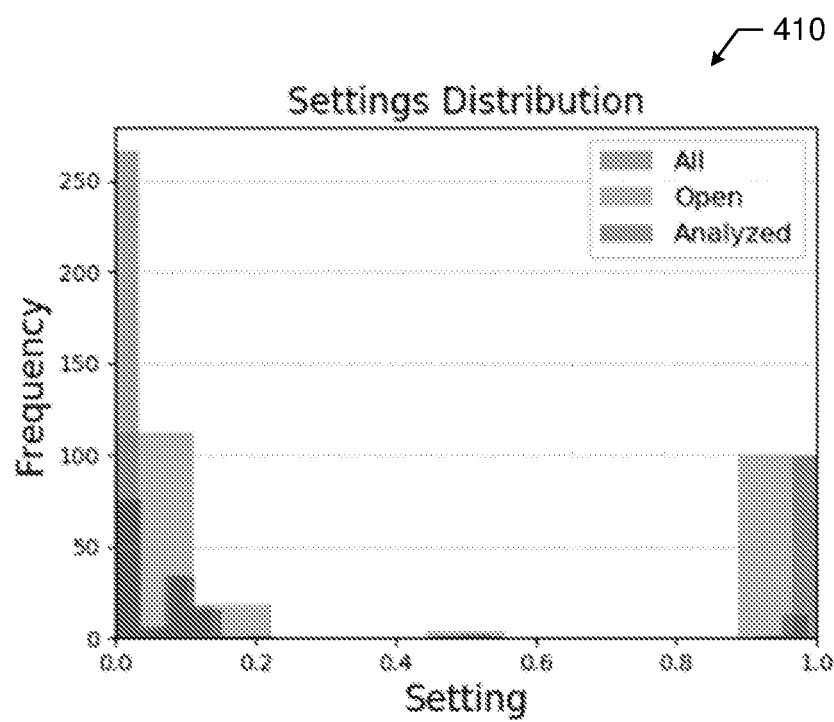
*FIG. 4.2*

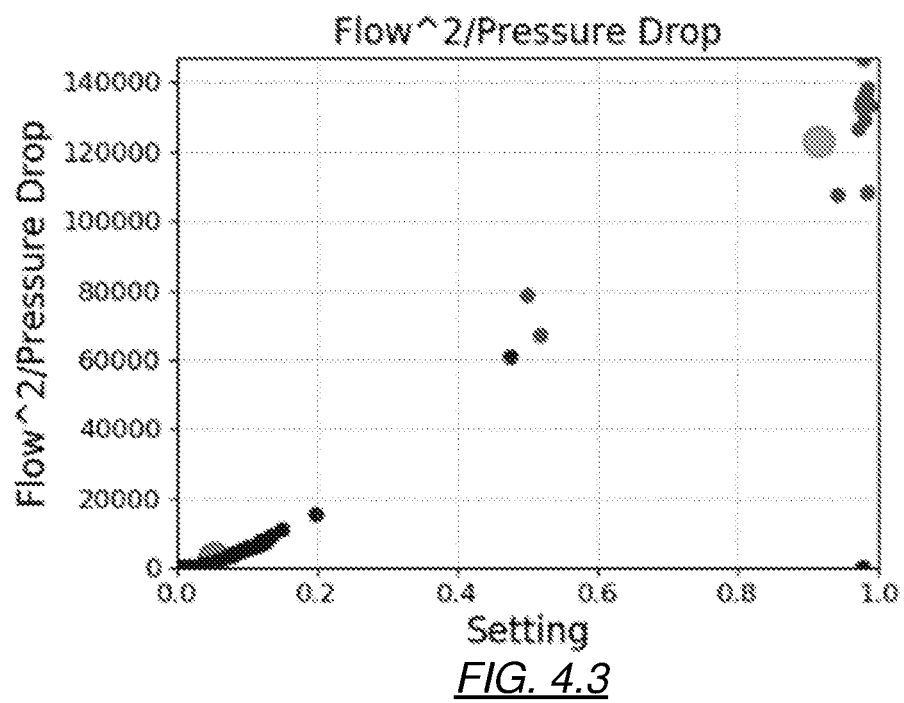
FIG. 4.3
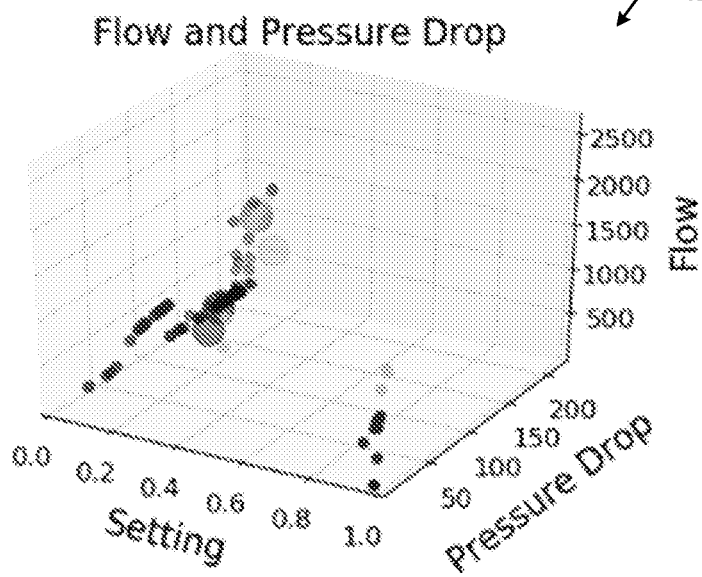
FIG. 4.4

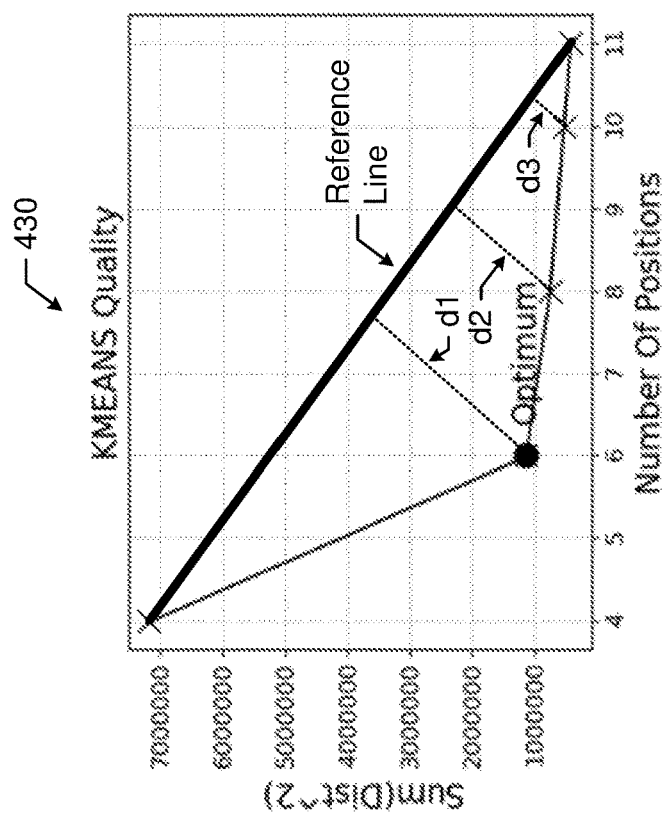
FIG. 4.6
FIG. 4.5

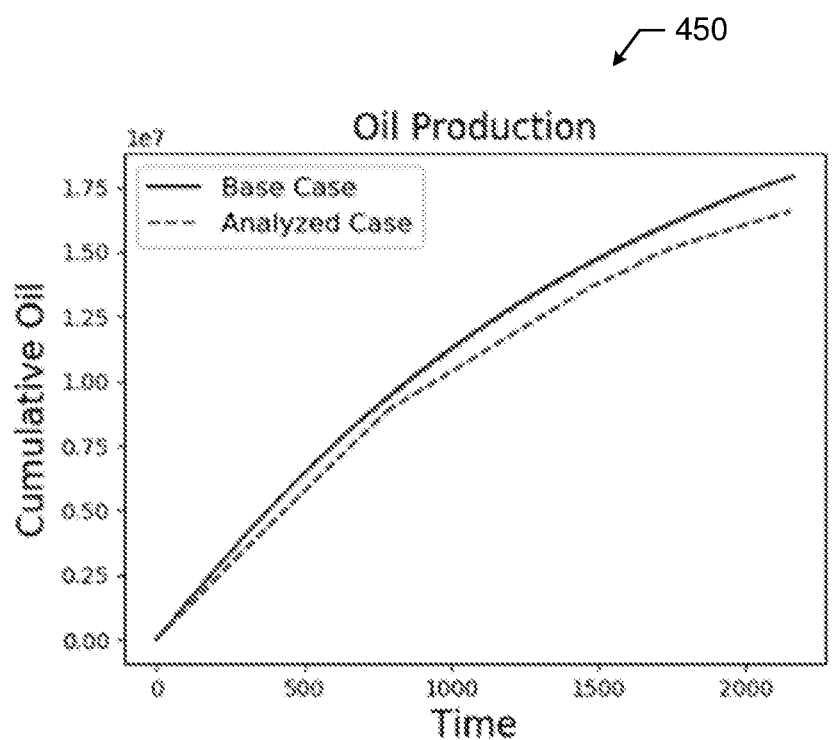
FIG. 4.7

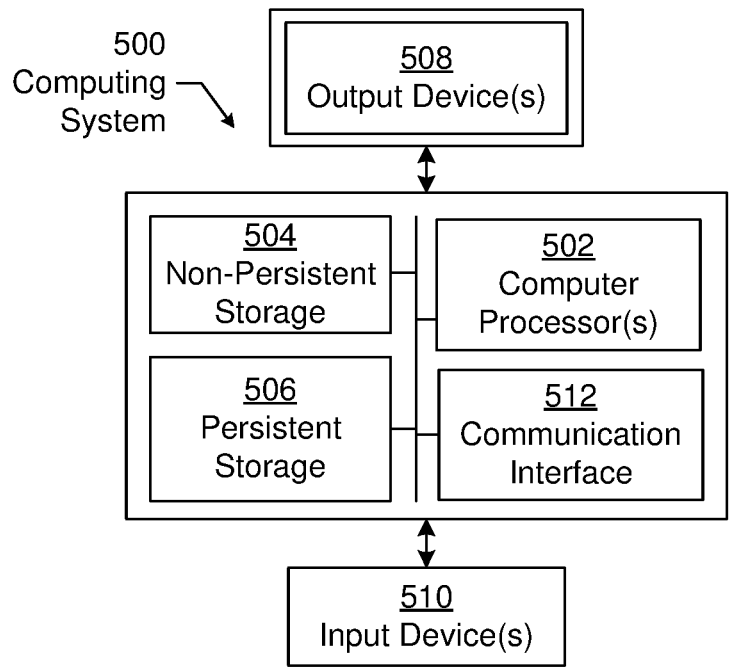
*FIG. 5.1*
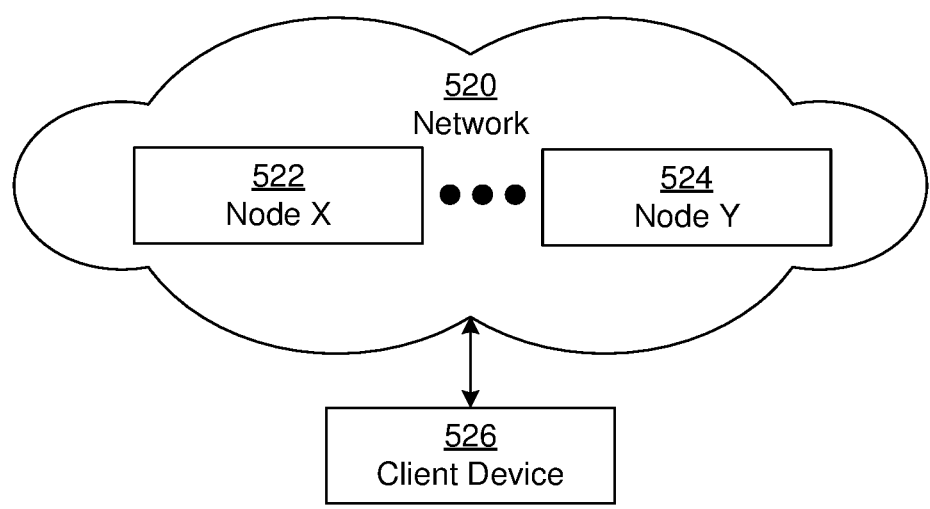
*FIG. 5.2*

FLOW CONTROL DEVICE OPENINGS FOR COMPLETION DESIGN

CROSS-REFERENCE TO RELATED APPLICATIONS

This application is a National Stage Entry of International Patent Application No. PCT/US2019/035171, filed on Jun. 3, 2019.

BACKGROUND

Computer systems are used for a variety of technological fields in order to model various aspects of a technology. For example, one use of computer systems is to model underground formations and model the extraction of hydrocarbons. Specifically, sensors at the oilfield gather large volumes of data downhole. The sensors send the large volumes of data to the computer system. Through the various techniques of mathematical modeling and simulations, the computer system attempts to create an optimal design for extracting hydrocarbons.

One configurable part of the process of extracting hydrocarbons is in the management of fluid flow using flow control devices. A flow control device is a device that control the flow of fluid into and/or out of a reservoir. A challenge exists in selecting or designing a flow control device for a field.

SUMMARY

In general, in one aspect, one or more embodiments relate to defining flow control device configurable positions. Defining flow control device configurable positions includes executing a reservoir simulator on a reservoir model to obtain a collection of flow control device settings defined in continuous space. For each number of multiple numbers of clusters, a cluster analysis is individually performed on the collection to obtain a set of flow control device configurable positions. The set includes the number of flow control device positions. Performing the cluster analysis across the numbers generates multiple sets for the multiple numbers of clusters. The sets of flow control device configurable positions are compared to obtain a selected set of flow control device configurable positions, which is presented in a completion design.

Other aspects of the technology will be apparent from the following description and the appended claims.

BRIEF DESCRIPTION OF DRAWINGS

FIGS. 3.1 and 3.2 show a flowchart in accordance with one or more embodiments.

FIGS. 4.1, 4.2, 4.3, 4.4, 4.5, 4.6, and 4.7 show example diagrams in accordance with one or more embodiments.

FIGS. 5.1 and 5.2 show a computing system in accordance with one or more embodiments.

DETAILED DESCRIPTION

Figure 1:
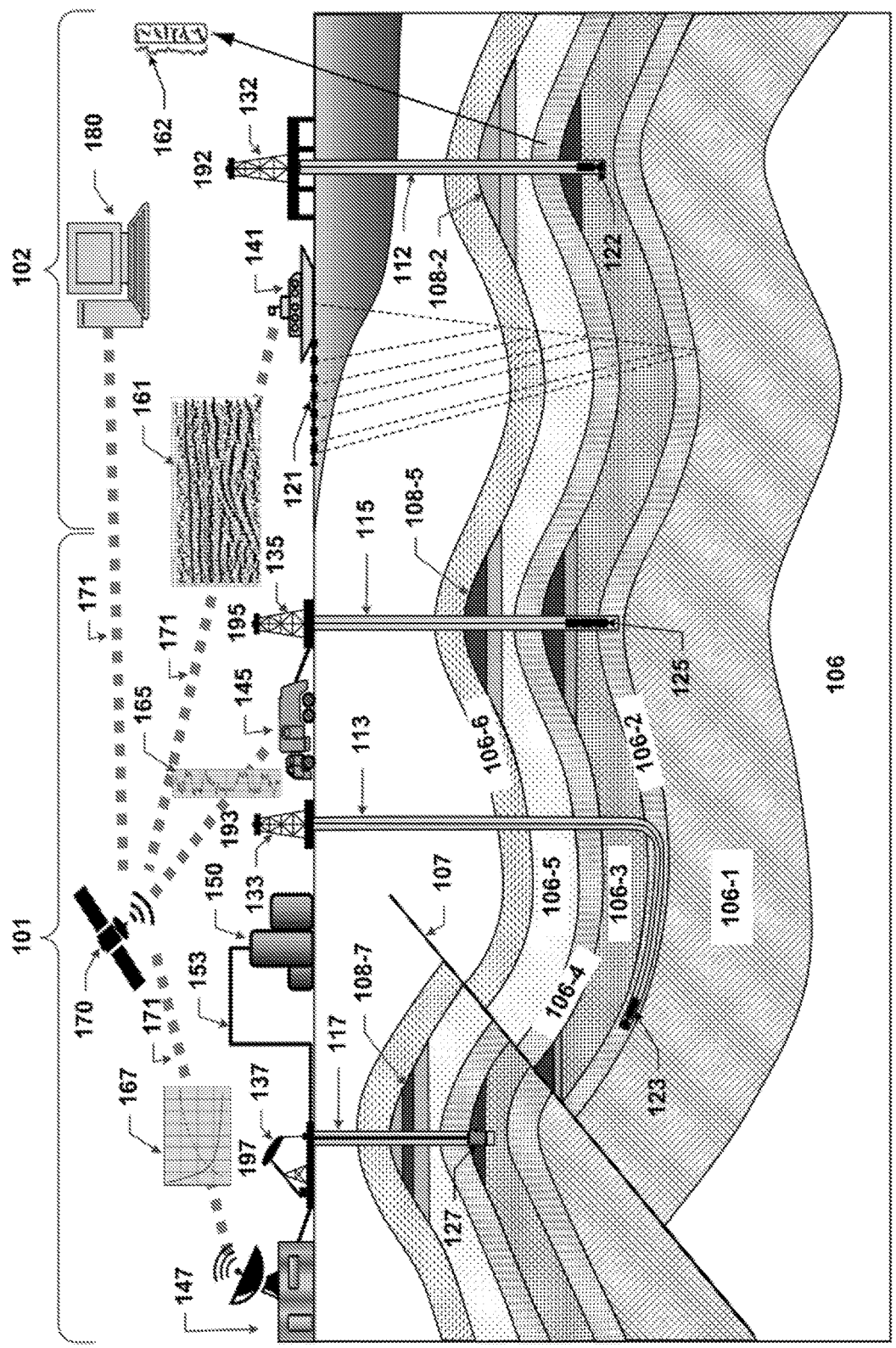
FIG. 1 depicts a schematic view, partially in cross section, of an onshore field and an offshore field in which one or more embodiments may be implemented.

Specific embodiments will now be described in detail with reference to the accompanying figures. Like elements in the various figures are denoted by like reference numerals for consistency. Further, in the figures, two or three collinear dots mean that more elements of the same type as before and after the collinear dots may optionally exist in accordance with one or more embodiments.

In the following detailed description of embodiments, numerous specific details are set forth in order to provide a more thorough understanding. However, it will be apparent to one of ordinary skill in the art that embodiments may be practiced without these specific details. In other instances, well-known features have not been described in detail to avoid unnecessarily complicating the description.

Throughout the application, ordinal numbers (e.g., first, second, third, etc.) may be used as an adjective for an element (i.e., any noun in the application). The use of ordinal numbers is not to imply or create any particular ordering of the elements nor to limit any element to be a single element unless expressly disclosed, such as by the use of the terms "before", "after", "single", and other such terminology. Rather, the use of ordinal numbers is to distinguish between the elements. By way of an example, a first element is distinct from a second element, and the first element may encompass more than one element and succeed (or precede) the second element in an ordering of elements.

In general, embodiments are directed to improving the accuracy and efficiency of a computer system when defining a discrete number of flow control device configurable positions for a well or multi-well system. Specifically, different oilfields, wells, and/or zones may have different numbers of configurable positions and different configurable positions for the flow control devices. While a greedy algorithm in conjunction with a reservoir simulator could be used to define a flow control device, such algorithm would be computationally expensive to execute on a computer system. Thus, one or more embodiments are directed to programming a computer system to determine a set of flow control device configurable positions. Specifically, a reservoir simulator is used to determine collection of settings that is defined in continuous space (i.e., as if the flow control device allowed for all configurable positions). Based on collection of settings, a cluster analysis is performed and the number and set of configurable positions is determined. The cluster-determined sets and numbers of configurable positions may be re-input into the simulator in order to guide and converge the iterations of the optimizer more directly and intuitively towards optimized solution. Accordingly, the computational efficiency of the computer system is greatly increased.

In some embodiments, the comparison is performed after benchmarking the production improvement key performance indicators (KPIs), such as cumulative oil, net present value (NPV), etc., of the clustering-based discrete positions against the ultimate-value from the initial-input from continuous space valves. The benchmarking may be in terms of optimal production objectives simulated like maximum oil barrels or oil NPV, minimum water (or watercut) and/or minimum gas (gas-oil-ratio GOR). The selected 'optimal discrete valve positions' input (e.g., how many discrete positions and its corresponding inflow area) are then applied as the input into modeling with the optimization workflow re-simulated to guide the optimizer toward final optimal oil as achievably close as possible towards the continuous space valves' oil cumulative production. It is then the selected discrete valves' multi-positions to be manufactured and run-in-hole.

FIG. 1 depicts a schematic view, partially in cross section, of an onshore field (101) and an offshore field (102) in which one or more embodiments may be implemented. In one or more embodiments, one or more of the modules and elements shown in FIG. 1 may be omitted, repeated, and/or substituted. Accordingly, embodiments should not be considered limited to the specific arrangement of modules shown in FIG. 1.

As shown in FIG. 1, the fields (101), (102) includes a geologic sedimentary basin (106), wellsite systems (192), (193), (195), (197), wellbores (112), (113), (115), (117), data acquisition tools (121), (123), (125), (127), surface units (141), (145), (147), well rigs (132), (133), (135), production equipment (137), surface storage tanks (150), production pipelines (153), and an exploration and production (E&P) computer system (180) connected to the data acquisition tools (121), (123), (125), (127), through communication links (171) managed by a communication relay (170).

The geologic sedimentary basin (106) contains subterranean formations. As shown in FIG. 1, the subterranean formations may include several geological layers (106-1 through 106-6). As shown, the formation may include a basement layer (106-1), one or more shale layers (106-2, 106-4, 106-6), a limestone layer (106-3), a sandstone layer (106-5), and any other geological layer. A fault plane (107) may extend through the formations. In particular, the geologic sedimentary basin includes rock formations and may include at least one reservoir including fluids, for example the sandstone layer (106-5). In one or more embodiments, the rock formations include at least one seal rock, for example, the shale layer (106-6), which may act as a top seal. In one or more embodiments, the rock formations may include at least one source rock, for example the shale layer (106-4), which may act as a hydrocarbon generation source. The geologic sedimentary basin (106) may further contain hydrocarbon or other fluids accumulations associated with certain features of the subsurface formations. For example, accumulations (108-2), (108-5), and (108-7) associated with structural high areas of the reservoir layer (106-5) and containing gas, oil, water or any combination of these fluids.

In one or more embodiments, data acquisition tools (121), (123), (125), and (127), are positioned at various locations along the field (101) or field (102) for collecting data from the subterranean formations of the geologic sedimentary basin (106), referred to as survey or logging operations. Further, although the sensors are shown as only at the end-point of the well, the sensors may be located along the trajectory of the well. For example, well (115) may be a multi-zonal well having one zone at section (108-5) and another zone at the end-point. Separate sensors may exist and acquire measurements for each zone. Each zone may have a corresponding separate valve.

In particular, various data acquisition tools are adapted to measure the formation and detect the physical properties of the rocks, subsurface formations, fluids contained within the rock matrix and the geological structures of the formation. For example, data plots (161), (162), (165), and (167) are depicted along the fields (101) and (102) to demonstrate the data generated by the data acquisition tools. Specifically, the static data plot (161) is a seismic two-way response time. Static data plot (162) is core sample data measured from a core sample of any of subterranean formations (106-1 to 106-6). Static data plot (165) is a logging trace, referred to as a well log. Production decline curve or graph (167) is a dynamic data plot of the fluid flow rate over time. Other data may also be collected, such as historical data, analyst user inputs, economic information, and/or other measurement data and other parameters of interest.

The acquisition of data shown in FIG. 1 may be performed at various stages of planning a well. For example, during early exploration stages, seismic data (161) may be gathered from the surface to identify possible locations of hydrocarbons. The seismic data may be gathered using a seismic source that generates a controlled amount of seismic energy. In other words, the seismic source and corresponding sensors (121) are an example of a data acquisition tool. An example of seismic data acquisition tool is a seismic acquisition vessel (141) that generates and sends seismic waves below the surface of the earth. Sensors (121) and other equipment located at the field may include functionality to detect the resulting raw seismic signal and transmit raw seismic data to a surface unit (141). The resulting raw seismic data may include effects of seismic wave reflecting from the subterranean formations (106-1 to 106-6).

After gathering the seismic data and analyzing the seismic data, additional data acquisition tools may be employed to gather additional data. Data acquisition may be performed at various stages in the process. The data acquisition and corresponding analysis may be used to determine where and how to perform drilling, production, and completion operations to gather downhole hydrocarbons from the field. Generally, survey operations, wellbore operations and production operations are referred to as field operations of the field (101) or (102). These field operations may be performed as directed by the surface units (141), (145), (147). For example, the field operation equipment may be controlled by a field operation control signal that is sent from the surface unit.

Further as shown in FIG. 1, the fields (101) and (102) include one or more wellsite systems (192), (193), (195), and (197). A wellsite system is associated with a rig or a production equipment, a wellbore, and other wellsite equipment configured to perform wellbore operations, such as logging, drilling, fracturing, production, or other applicable operations. For example, the wellsite system (192) is associated with a rig (132) and a well having a wellbore (112) and drilling equipment to perform drilling operation (122). In one or more embodiments, a wellsite system may be connected to a production equipment. For example, the well system (197) is connected to the surface storage tank (150) through the fluids transport pipeline (153).

The well may include one or more flow control devices located along the length of the trajectory of the well. Flow control devices are physical devices that control the flow of fluid in the well, and between the subsurface formation and the well. For example, the flow control devices may be, a discrete flow control device, an inflow control device (ICD), active inflow control devices (e.g., flow control valves), and an autonomous flow control device (AICD). ICDs generally have a single fixed position. AICDs have a fixed valves with moving parts or fluid viscosity-sensitivities geometry that provide autonomous or continuous reactive response to reservoir flow that aim to reduce water and/or gas production depending on the fluid properties, types, mixtures and/or pressure contrast. Unlike continuous-space and discrete types of flow control devices, ICDs and AICDs are not configurable after installation. An example of an active and continuous space flow control device is a MANARA® valve. MANARA® is a registered trademark of Schlumberger Technology Corporation located in Houston, TX. AICD and ICD may have only on/off positions. Any flow control valves may be used, such as permanently, semi-permanently, or temporarily deployed valves.

At least a subset of the flow control devices in the well have multiple unique configurable positions. Each configurable position defines the size of the opening of the flow control device (i.e., the amount of flow and/or pressure-drop design allowed by the flow control device). The configurable positions may each be defined as a percentile opening as a value between zero and one, inclusive. The configurable positions may be defined as an absolute value of the size of the opening.

The configurable positions are static. Specifically, once the flow control device is manufactured, the configurable positions do not change. One or more embodiments are directed to designing flow control devices for an oilfield. In one or more embodiments, the flow control devices have a limited discrete number of configurable positions. Determining the set of configurable positions is based on a cluster analysis of flow control device settings defined in continuous space. Based on the cluster analysis, the number of configurable positions and the values (i.e. inflow area or diameter) of the configurable positions are determined. Accordingly, a customized or predefined flow control device may be created that has the number and values of the configurable positions. As another example, a mass-produced existing flow control device may be selected that closely matches the number and values.

The well may be physically partitioned into zones. Each zone may be separated by packers or other equipment that is located in the wellbore. This is called well segmentation by zones. Zones provide a technique to individually manage portions of the well. Flow control devices are accordingly partitioned into groups based on the flow control devices respective locations along the well. Flow control devices may be partitioned, such as, but not limited to, being partitioned in addition to the zones of a well, into groups based on the well. In other words, flow control devices of a field may be partitioned based on the wells in which the flow control devices are managed. Each partition is a group of flow control devices. One or more embodiments of the technology described in the present application may be applied individually for each group to define a set of configurable positions of the flow control devices in the group. Different groups may have differently defined sets of configurable positions.

As another example, one or more embodiments may define a set of configurable positions that are uniform across a field. As another example, one or more embodiments may define a set of configurable positions for a flow control device that is uniform across a well.

In one or more embodiments, the surface units (141), (145), and (147), are operatively coupled to the data acquisition tools (121), (123), (125), (127), and/or the wellsite systems (192), (193), (195), and (197). In particular, the surface unit is configured to send commands to the data acquisition tools and/or the wellsite systems and to receive data therefrom. In one or more embodiments, the surface units may be located at the wellsite system and/or remote locations. The surface units may be provided with computer facilities (e.g., an E&P computer system) for receiving, storing, processing, and/or analyzing data from the data acquisition tools, the wellsite systems, and/or other parts of the field (101) or (102). The surface unit may also be provided with, or have functionality for actuating, mechanisms of the wellsite system components. The surface unit may then send command signals to the wellsite system components in response to data received, stored, processed, and/or analyzed, for example, to control and/or optimize various field operations described above.

In one or more embodiments, the surface units (141), (145), and (147) are communicatively coupled to the E&P computer system (180) via the communication links (171). In one or more embodiments, the communication between the surface units and the E&P computer system may be managed through a communication relay (170). For example, a satellite, tower antenna or any other type of communication relay may be used to gather data from multiple surface units and transfer the data to a remote E&P computer system for further analysis. Generally, the E&P computer system is configured to analyze, model, control, optimize, or perform management tasks of the aforementioned field operations based on the data provided from the surface unit. In one or more embodiments, the E&P computer system (180) is provided with functionality for manipulating and analyzing the data, such as analyzing seismic data to determine locations of hydrocarbons in the geologic sedimentary basin (106) or performing simulation, planning, and optimization of exploration and production operations of the wellsite system. In one or more embodiments, the results generated by the E&P computer system may be displayed for user to view the results in a two-dimensional (2D) display, three-dimensional (3D) display, or other suitable displays. Although the surface units are shown as separate from the E&P computer system in FIG. 1, in other examples, the surface unit and the E&P computer system may also be combined. The E&P computer system and/or surface unit may correspond to a computing system, such as the computing system shown in FIGS. 10.1 and 10.2 and described below.

Figure 2:
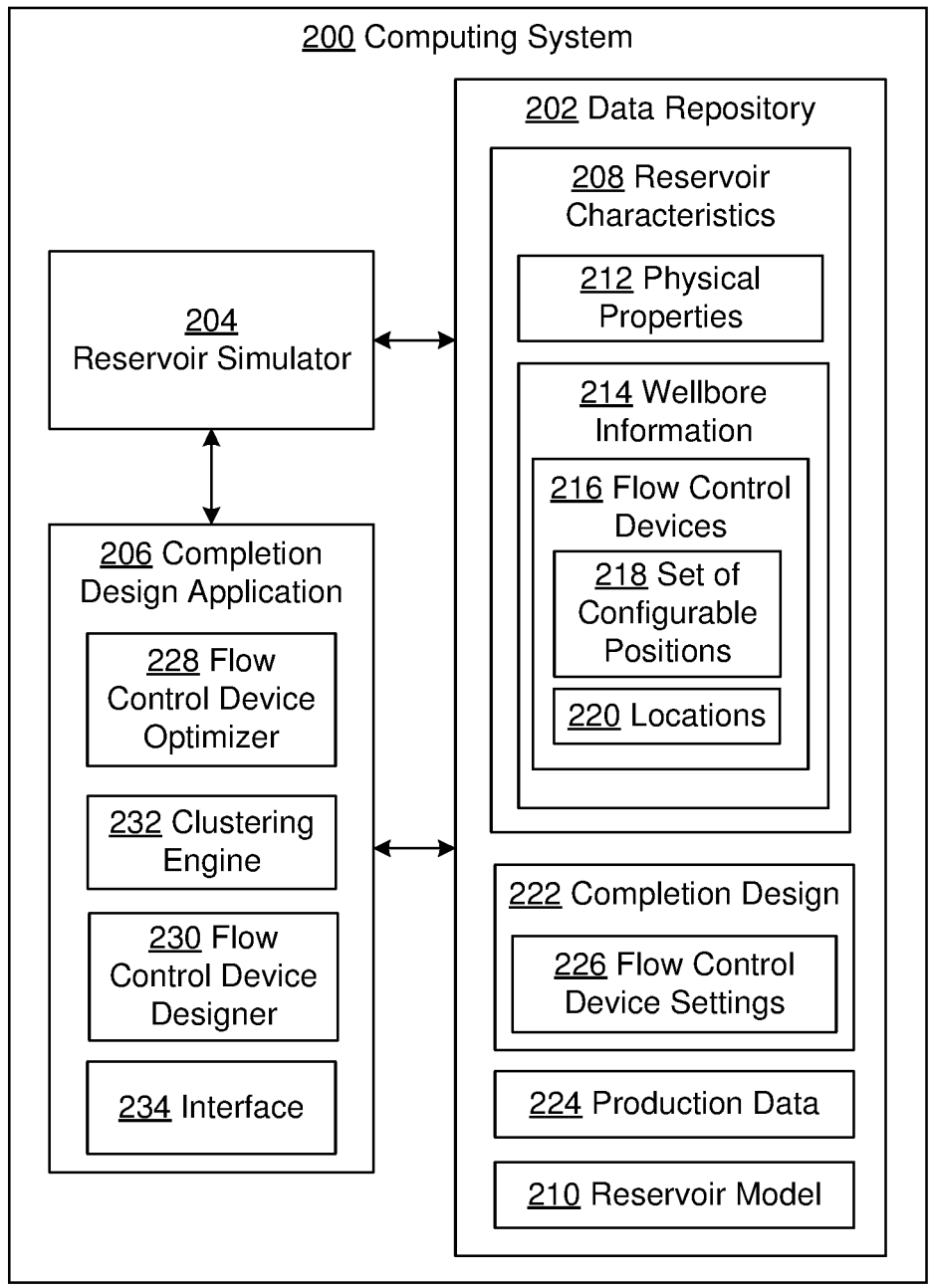
FIG. 2 shows a computer system in accordance with one or more embodiments.

FIG. 2 shows a computing system (200), which may be the same as computing system (180) in FIG. 1. The hardware components of computing system (200) is described in further detail below and in FIGS. 5.1 and 5.2. The computing system includes a completion design application (206) and a data repository (202).

In one or more embodiments of the technology, the data repository (202) is any type of storage unit and/or device (e.g., a file system, database, collection of tables, physical memory, or any other storage mechanism) for storing data. The storage of data may be permanent, semi-permanent, or temporary (e.g., during execution of the completion design application (206)). Further, the data repository (202) may include multiple different storage units and/or devices. The multiple different storage units and/or devices may or may not be of the same type or located at the same physical site.

The data repository (202) includes functionality to store reservoir characteristics (208). The reservoir characteristics (208) is information about the subsurface formations from which hydrocarbons may be produced. The reservoir characteristics (208) may further include information about the wellbore. The reservoir characteristics (208) may be input for the reservoir model (210), discussed below. Reservoir characteristics (208) includes physical properties (212) and wellbore information (214) for one or more wells.

Physical properties (212) includes reservoir properties, fluid properties, and flow properties. For example, the reservoir properties may include information about the physical properties of the subsurface formations, such as porosity, permeability, gamma ray logs, pressures etc. that is gathered from the seismic and other sensors described above with reference to FIG. 1. The fluid may include hydrocarbons from the reservoir, water, and/or other types of fluids. Fluid properties include fluid density, viscosity, composition of particles in the fluid, and other properties of the fluid. Flow properties include temperature, pressure, amount, rate, and other aspects of flow.

Wellbore information (214) is information describing the wellbore, such as the wellbore in FIG. 1. For example, wellbore information (214) may include information about the geometry (e.g., shape) and trajectory (e.g., path) of the wellbore. One or more embodiments may be applied to a single lateral, multi-lateral, or multi-well configuration. Wellbore information (214) may also include information about the upstream devices connected to the wellbore for completion operations. Wellbore information (214) may also include information about flow control devices (216) in the well. In particular, the information about the flow control devices may include the locations (220) of the respective flow control devices. The flow control device may be any type of flow control device, such as the various types described above and in FIG. 1. The information about the flow control devices may further include the set of configurable positions that is determined using one or more embodiments of the technology. A flow control device setting is the size of the opening for a particular duration of time. In one or more embodiments, the flow control device setting of a flow control device may be a selection of a particular configurable position, from the set of configurable positions, for a duration of time. If selected from continuous space, then the flow control device setting may be any value of opening. For example, if defined as a percentile opening, then the flow control device setting may be a value between 0 and 1 inclusive.

Continuing with the data repository (202), the data repository (202) may also include functionality to store a completion design (222), production data (224), and a reservoir model (210).

A completion design (222) is a specification of the configuration of physical equipment in the oilfield to extract hydrocarbons. In one or more embodiments, the completion design (222) may specify the flow control device settings (226), as selected from the set of configurable positions, for various durations of time.

Production data (224) is information about the volume, composition, velocity, and other aspects of the hydrocarbons produced from the wellbore. In one or more embodiments, the production data (224) is dependent on the completion design.

A reservoir model (210) is a model of an oilfield reservoir. In one or more embodiments, the reservoir model (210) is defined as a grid spanning a subsurface region. The grid may be a regular grid or irregular grid. Each location in the grid is a grid cell. The size of the grid cell is the scale at which the reservoir model models the subsurface formations with the reservoir. Each grid cell has physical properties defined for the grid cell. For example, the physical properties may be porosity, permeability, composition, pressure gradients, or other properties as described above. The reservoir model (210) may further include information about fluid flow through the reservoir. The physical properties may be obtain using the oilfield equipment described above with reference to FIG. 1.

The reservoir model may have one or more reservoir model states. A reservoir model state is the state of the reservoir model for a particular period of time. Specifically, the reservoir model state is the one or more sets of physical property values assigned to grid cells for the particular period of time. The reservoir model state may be a snapshot, such as by having a single value for each property and each grid cell) or may be include changes over the time period, such as including a collection of values that span the period.

Continuing with FIG. 2, The reservoir simulator (204) includes functionality to simulate the flow of fluids through the subsurface formations and the wellbores. Specifically, the reservoir simulator (204) includes functionality to determine the amount of flow, composition, pressure, of fluids through the various rock formations and wellbore using the reservoir model (204). The reservoir simulator (204) may operate through various time periods, where each time period represents a period of actual time (e.g., hour, day, week, etc.). For example, the reservoir simulator (204) may be configured to predict values representing composition and amounts of fluid at each grid cell and location along the wellbore. Other outputs of the reservoir modeling tool may exist and be used.

A completion design application (206) is communicatively connected to the data repository (202) and the reservoir simulator (204). For example, the completion design application (206) includes functionality to read, write, and store data in the data repository (202). The completion design application (206) may further be configured to issue calls to the reservoir simulator for model calibration prior to simulate the reservoir for production optimisation and production prediction through one or more time periods. The completion design application (206) includes functionality to generate a completion design (222) based on a reservoir model (210). The completion design application (206) may include functionality to store data in the data repository (202) temporarily or at least semi permanently. For example, the data stored may be for use of the completion design application (206) while generating the completion design (222).

In one or more embodiments, the completion design application (206) includes a flow control device optimizer (228), a clustering engine (232), a flow control device designer (230), and an interface (234). The flow control device optimizer (228) is configured to select, in continuous space, flow control device settings for flow control devices based on reservoir simulations. The optimizer (228) may also configured to be able to simulate discrete-valves or fix valves based on input setting randomly by a predefined numbers of valves and valves' inflow area physically input. The clustering engine (232) is configured to generate clusters for the flow control device settings. The clustering engine (232) may be a third party clustering engine. The flow control device designer (230) is configured to determine a set of flow control device configurable positions. For example, the flow control device designer may be configured to perform at least some of the operations of FIG. 3.1. The interface (234) may be an application programming interface, a user interface or other interface.

FIGS. 3.1 and 3.2 show flowcharts in accordance with one or more embodiments of the technology. While the various blocks in the flowcharts are presented and described sequentially, one of ordinary skill will appreciate that at least some of the blocks may be executed in different orders, may be combined or omitted, and at least some of the blocks may be executed in parallel. Furthermore, the steps may be performed actively or passively. For example, some steps may be performed using polling or be interrupt driven in accordance with one or more embodiments of the technology.

FIG. 3.1 shows operations for designing a flow control device in accordance with one or more embodiments. In Block 301, a reservoir simulator is executed on a reservoir model to obtain a collection of flow control device settings defined in continuous space. One or more reservoir simulations is performed to obtain one or more reservoir model states in accordance with one of more embodiments. Based on the reservoir model states, the flow control device optimizer assigns flowrates to the various flow control devices in the reservoir. Various techniques may be used to assign flowrates to the flow control devices. For example, some technique involves streamline analysis, such as described in PCT Patent Publication No. WO/2018/201117. Other techniques, such as described in U.S. Patent Publication No. 2016/0061003, and greedy techniques may be used. In one or more embodiments, the simulation is performed by assigning an initial set of flowrates based on a prior simulation iteration to the completion devices in the wells. The reactions to the set of flowrates and other parameters of production are simulated using the reservoir model during the simulated time period. The result is a reservoir model state that has values of physical properties of the reservoir including composition of fluids for the time period. Based on the result, a set of target flowrates are defined by the flow control device optimizer. The set of target flowrates match flow control device settings defined in continuous space. In other words, at Block 301, the flow control device settings are not limited to a particular set of configurable positions, but rather may be any value between the fully opened value (i.e., the flowrate is the maximum allowed by the device) and the fully closed value (i.e., the flowrate is zero), inclusive. Block 301 may be performed for multiple time periods. The multiple time periods may span the production and completion operations of the well or wells.

The result of performing Block 301 one or more times is a collection of flow control device settings. Because, once built, the configurable positions are static for a discrete flow control device, temporal information may be deemed irrelevant to the flow control device settings. Further, when flow control devices that will have the same set of configurable positions are in a group, and the collection is defined for the group. In such as scenario, which flow control device that is a member of the group and has a particular setting may be deemed irrelevant. In one or more embodiments, each flow control device setting is associated with one or more fluid and/or flow properties. Other physical properties, whether direct or derived properties, may be related to the flow control device setting in the collection.

In Block 303, individually, for each of multiple numbers of clusters, cluster analysis on the collection to obtain a set of flow control device configurable positions, the set having the number of configurable positions. Different flow control devices may have different number of configurable positions. Thus, in addition to determining the optimum set of configurable positions, one or more embodiments further determine the size of the set (i.e., the number of configurable positions). In general, a larger number of configurable positions is more expensive. One or more embodiments perform the cluster analysis multiple times on the same collection of flow control device settings, each time specifying a different number of clusters.

In one or more embodiments, k-means clustering, or a heuristic algorithm based on k-means clustering, is performed on the collection. In k-means clustering, each flow control device setting, and corresponding physical properties is a d-dimensional real vector. The k-means clustering partitions the collection of flow control device settings into k sets. For a given number of positions, the partitioning is performed to minimize the sum of squares (i.e. variance) between the selected positions (Block 303) and the optimized positions of the continuous space (Block 301) In one or more embodiments, besides the flow control device setting, each additional dimension corresponds to a different physical property. Thus, as the number of physical properties increases, the clustering operations becomes more computationally expensive. In one or more embodiments, only two or three physical properties are considered. However, additional physical properties may be used without departing from the scope of the technology. In one or more embodiments, the result of the cluster analysis is k clusters. The mean on the flow control device setting dimension is the flow control device setting value for the cluster in one or more embodiments. Thus, the set of flow control device settings includes the mean of each of the clusters in one or more embodiments.

In one or more embodiments, prior to performing the k-means clustering, flow control device settings in the set that are fully opened or fully closed are removed. The filtering may include a tolerance (e.g., 99% opened is fully opened, and 1% opened is considered fully closed). Other tolerances may be used without departing from the scope of the technology. In such embodiments, the clustering analysis may reduce the number of clusters by 2 for each number to account for adding back in the fully opened and fully closed positions. Thus, for a number of 5, the k-means clustering may be performed to identify 3 clusters on the filtered collection, and the positions of fully opened and fully closed may be added back in after the cluster analysis. Although the above is discussed with respect to k-means clustering, other cluster analysis may be used without departing from the scope of the technology.

As described above, the cluster analysis is repeated multiple times for different numbers of clusters. For example, the cluster analysis may be performed to generate three clusters from the collection, then performed to generate four clusters from the collection, and so forth. The result of performing the cluster analysis multiple times is to generate multiple sets of flow control device settings, the sizes of the sets varies between sets. In other words, the number of configurable positions in the sets is different for each set. In one or more embodiments, the numbers are the integers between 2 and 15. For example, the cluster analysis may be performed individually for the numbers 3, 4, 6, 8, 10, and 12.

The sets of configurable positions may further include, for each valve position, a corresponding mean value of the inflow area of the valve position. In such embodiments, not only is the position defined in terms of percentage of opening, the inflow area may also be defined.

In Block 305, the sets of flow control device configurable positions are compared to obtain a selected set of flow control device configurable positions. The selected set may be deemed as the optimal set. In one or more embodiments, each set corresponds to a determined optimal set of flow control device positions for the corresponding number. In other words, the collection of flow control device settings may have as many different flow control device setting values as number of settings in the collection and is deemed optimal in continuous space. Comparably, the set of flow control device configurable positions identified in Block 303 are deemed optimal for the corresponding defined number (i.e., size of the set). In Block 305, the optimal number of configurable positions are determined by a comparison.

Various different functions may be used to perform the comparison. One technique for performing the comparison is by defining a pair for each set. The pair includes the number (i.e., size of the set) and the sum of the variances for the set. A reference line is calculated from the pair having the lowest number and to the pair having the highest number. For each pair, a perpendicular distance to the reference line is determined. The pair having the maximal perpendicular distance is selected. The set matching the pair is selected as the selected set of flow control device configurable positions.

Another technique may be performed based on net present value analysis. In other words, simulations may be performed to determine the differences in expected production amounts and the differences in the cost of the flow control devices.

In Block 307, the selected set of flow control device configurable positions are presented in one or more embodiments. In one or more embodiments, the set of flow control device configurable positions are presented in a graphical user interface and/or in an application programming interface. As another example, the presenting may be to transmit the selected set to another computer and/or storage device. Based on the selected set of flow control device configurable positions, manufacturing equipment may manufacture flow control devices having the selected set of configurable positions within a tolerance level. Thus, the customized flow control devices may be deployed in the field. By way of another example, an existing mass-produced flow control device may be selected based on a difference between the flow control device configurable positions of the existing mass-produced flow control device and the selected set of flow control device configurable positions. In other words, one or more embodiments may be used to select a particular mass-produced flow control device by determining which mass-produced flow control device best matches the set of flow control device configurable positions.

The steps in FIG. 3.1. may be followed to design flow control devices that include Inflow Control Devices (ICDs) and Autonomous Flow Control Devices (AICDs). For ICDs/AICDs design, their limitations can be included in Block 303 to select valid configurations.

Multiple executions of the steps of FIG. 3.1 can present a set of completion design options covering a wide range of flow control devices types.

FIG. 3.2 shows a flowchart for generating a completion design in accordance with one or more embodiments. In Block 309, the reservoir simulator is executed on the reservoir model with the selected set of flow control device configurable positions to obtain a completion design. Block 309 may be performed in a same or similar manner to Block 301. However, in Block 309, the flow control device settings determined are only from the selected set (so-called optimal set) of flow control device configurable positions rather than from continuous space. In one or more embodiments, a flow control device setting is defined for each flow control device, or a subset of flow control devices, and is defined for a particular time period. Thus, the same flow control device may have different flow control device settings for different time periods.

In Block 311, the completion design is presented in accordance with one or more embodiments. In one or more embodiments, the completion design is presented in a graphical user interface and/or in an application programming interface. As another example, the presenting may be to transmit the completion design to another computer and/or storage device. Results validation may be performed simulator runs or other techniques, such as operating the valve physically to the nearest-matched presenting numbers and allowing such input for confirmation of the results. An oilfield operation may be performed based on the completion design. Specifically, after deploying the flow control devices having the selected set of flow control device configurable positions, the settings of the flow control devices may be set according to the settings in the completion design. Thus, hydrocarbons may be produced from the optimal setting for optimal production (i.e. incremental oil in reducing water or gas or incremental gas in reducing water) based on the completion design.

One or more embodiments provide a technique to optimize the discrete valve openings of flow control devices. In one or more embodiments, greater reservoir sweep with both reactive and proactive optimization objective functions is realized. Further, one or more embodiments may achieve net present value maximization through a combination of water/gas/oil minimization and/or maximization In one or more embodiments, the basic steps of one or more embodiments of the technology are to perform the following. The numerical simulation is started and a full continuous valve optimization workflow is performed. From the optimized continuous valve simulation, a data set of the valve openings that were used throughout the life of the simulation is extracted. The data set is the collection of flow control device configurable settings. In some embodiments, fully open/closed valve openings are filtered from the data set of valve openings. Cluster analysis is performed for a set of user defined cluster counts (i.e., number of intermediate openings) to determine a set of optimum openings. The set of cluster analysis is processed to determine the optimal number of openings. The model may be updated with the optimal valve openings and the numerical simulator may be re-run with optimized discrete valve settings.

Turning now to the example diagrams, FIG. 4.1 shows a diagram (400) of a numerical simulation stage. Specifically, from a reservoir model (402), numerical simulation is performed with continuous valve position optimization being executed at a frequency defined by the user (e.g., daily, weekly, monthly, quarterly or annually). This user defined frequency defines the maximum number of positional changes for each valve throughout the life of the simulation. The simulation can be for a single well (e.g., well (404)), multi-well or full field. For each of the wells within the simulation, the valves may have any valve opening between fully closed to fully open throughout the life of the simulation. The result of this step is an optimized position for each valve at each time step throughout the entire simulation (as shown in diagram (406)), effectively providing the optimal solution for continuous valves.

Using the optimized simulation results for continuous valves, the used valve openings are extracted from the available time periods. The extracted openings may be grouped by valve, by groups of valves, by well or across the entire field depending on the number of unique discrete valves allowed for the wells. FIG. 4.2 shows a histogram graph (410) of flow control device settings distribution. The horizontal axis is the flow control device setting and the vertical axis is the frequency of the flow control device setting in the collection.

The valve openings are then processed to filter out openings which correspond to the valve being either fully closed or fully open. This filtering is based upon a user defined tolerance. e.g. valves might be considered to be fully open if the fractional opening is greater than 0.99. The filtered set of valve openings defined the data used for further analysis. The fully closed and fully open values define 2 of the positions that comprise the design of the valve.

FIGS. 4.3 and 4.4 show example diagrams (416, 420) for cluster analysis. In one or more embodiments, the user defines a set of the numbers of intermediate positions to be evaluated and the data to be considered for the cluster analysis. The data in the collection might be pairs having the flow control device setting and a relationship between the flow and pressure drop such as shown in the graph (416) of FIG. 4.3. The data in the collection might be tuples having the flow control device setting, the pressure drop, and the flow as shown in the graph (420) of FIG. 4.4.

A K-Means data clustering analysis is executed for each of the different numbers of intermediate positions. The number of intermediate positions is the cluster count for each analysis. The K-Means cluster analysis groups points that are in close proximity to each other and yields a set of cluster centers that are considered to be the optimum openings for the set.

From the cluster analysis, a comparison is performed. FIGS. 4.5 and 4.6 shows example diagrams of the comparison. Each cluster analysis executed in the previous step gives a quality which is defined as the sum of the distances between each point to its associated cluster. Thus, for each number of clusters (i.e., number of positions on horizontal axis in graph (430) of FIG. 4.5), a pair exists having the number and the quality indicator (shown on the vertical axis of graph (430)). The quality indicator may be Sum(Dist ^2). Elbow analysis is performed on the set of cluster analyses to determine the optimum number of intermediate positions. The elbow analysis identifies a reference line connecting a pair having a smallest number to a pair having the largest number. The perpendicular distances (i.e., d1, d2, and d3) to the reference line are compared to identify that the optimal number of positions is 6 in the example. Although Elbow analysis is described, other techniques may be used, such as Average Silhouette or Gap Statistic.

Chart 4.6 shows a chart (432) the set of flow control device configurable positions for each number. As shown FIG. 4.6, based on the analysis, the selected set of flow control device configurable positions includes 0.0, 0.149, 0.2274, 0.2637, 0.2902, and 1.0.

Based on the selected set of flow control device configurable positions, the numerical simulation model is updated and re-executed. The numerical simulation is re-run using the optimal discrete valve positions to provide a solution. The solution is effectively a discrete valve optimized intelligent completion design for each target.

Graph (450) of FIG. 4.7 shows an example of the performance with the optimized set of discrete valve positions (Analyzed Case) as compared against the simulation with continuous valve positions (Base Case). The Base Case in which a valve may have any size opening is consider optimal. As shown, the analyzed set using the technique described above is similar to the base case as shown in graph (450). The benchmarking analysis shown in FIG. 4.7 may be performed and/or presented prior to or with the presented the completion design. The benchmarking analysis shows to the user and/or computer system the degree to which the results close to the ultimate continuous-space Best-Value typically as annotated as Base-case in FIG. 4.7.

Embodiments of the technology may be implemented on a computing system. Any combination of mobile, desktop, server, router, switch, embedded device, or other types of hardware may be used. For example, as shown in FIG. 5.1, the computing system (500) may include one or more computer processors (502), non-persistent storage (504) (e.g., volatile memory, such as random access memory (RAM), cache memory), persistent storage (506) (e.g., a hard disk, an optical drive such as a compact disk (CD) drive or digital versatile disk (DVD) drive, a flash memory, etc.), a communication interface (512) (e.g., Bluetooth interface, infrared interface, network interface, optical interface, etc.), and numerous other elements and functionalities.

The computer processor(s) (502) may be an integrated circuit for processing instructions. For example, the computer processor(s) may be one or more cores or micro-cores of a processor. The computing system (500) may also include one or more input devices (510), such as a touchscreen, keyboard, mouse, microphone, touchpad, electronic pen, or any other type of input device.

The communication interface (512) may include an integrated circuit for connecting the computing system (500) to a network (not shown) (e.g., a local area network (LAN), a wide area network (WAN) such as the Internet, mobile network, or any other type of network) and/or to another device, such as another computing device.

Further, the computing system (500) may include one or more output devices (508), such as a screen (e.g., a liquid crystal display (LCD), a plasma display, touchscreen, cathode ray tube (CRT) monitor, projector, or other display device), a printer, external storage, or any other output device. One or more of the output devices may be the same or different from the input device(s). The input and output device(s) may be locally or remotely connected to the computer processor(s) (502), non-persistent storage (504), and persistent storage (506). Many different types of computing systems exist, and the aforementioned input and output device(s) may take other forms.

Software instructions in the form of computer readable program code to perform embodiments of the technology may be stored, in whole or in part, temporarily or permanently, on a non-transitory computer readable medium such as a CD, DVD, storage device, a diskette, a tape, flash memory, physical memory, or any other computer readable storage medium. Specifically, the software instructions may correspond to computer readable program code that, when executed by a processor(s), is configured to perform one or more embodiments of the technology.

The computing system (500) in FIG. 5.1 may be connected to or be a part of a network. For example, as shown in FIG. 5.2, the network (520) may include multiple nodes (e.g., node X (522), node Y (524)). Each node may correspond to a computing system, such as the computing system shown in FIG. 5.1, or a group of nodes combined may correspond to the computing system shown in FIG. 5.1. By way of an example, embodiments of the technology may be implemented on a node of a distributed system that is connected to other nodes. By way of another example, embodiments of the technology may be implemented on a distributed computing system having multiple nodes, where each portion of the technology may be located on a different node within the distributed computing system. Further, one or more elements of the aforementioned computing system (500) may be located at a remote location and connected to the other elements over a network.

Although not shown in FIG. 5.2, the node may correspond to a blade in a server chassis that is connected to other nodes via a backplane. By way of another example, the node may correspond to a server in a data center. By way of another example, the node may correspond to a computer processor or micro-core of a computer processor with shared memory and/or resources.

The nodes (e.g., node X (522), node Y (524)) in the network (520) may be configured to provide services for a client device (526). For example, the nodes may be part of a cloud computing system. The nodes may include functionality to receive requests from the client device (526) and transmit responses to the client device (526). The client device (526) may be a computing system, such as the computing system shown in FIG. 5.1. Further, the client device (526) may include and/or perform all or a portion of one or more embodiments of the technology.

The computing system or group of computing systems described in FIGS. 5.1 and 5.2 may include functionality to perform a variety of operations disclosed herein. For example, the computing system(s) may perform communication between processes on the same or different system. A variety of mechanisms, employing some form of active or passive communication, may facilitate the exchange of data between processes on the same device. Examples representative of these inter-process communications include, but are not limited to, the implementation of a file, a signal, a socket, a message queue, a pipeline, a semaphore, shared memory, message passing, and a memory-mapped file. Further details pertaining to a couple of these non-limiting examples are provided below.

Based on the client-server networking model, sockets may serve as interfaces or communication channel endpoints enabling bidirectional data transfer between processes on the same device. Foremost, following the client-server networking model, a server process (e.g., a process that provides data) may create a first socket object. Next, the server process binds the first socket object, thereby associating the first socket object with a unique name and/or address. After creating and binding the first socket object, the server process then waits and listens for incoming connection requests from one or more client processes (e.g., processes that seek data). At this point, when a client process wishes to obtain data from a server process, the client process starts by creating a second socket object. The client process then proceeds to generate a connection request that includes at least the second socket object and the unique name and/or address associated with the first socket object. The client process then transmits the connection request to the server process. Depending on availability, the server process may accept the connection request, establishing a communication channel with the client process, or the server process, busy in handling other operations, may queue the connection request in a buffer until server process is ready. An established connection informs the client process that communications may commence. In response, the client process may generate a data request specifying the data that the client process wishes to obtain. The data request is subsequently transmitted to the server process. Upon receiving the data request, the server process analyzes the request and gathers the requested data. Finally, the server process then generates a reply including at least the requested data and transmits the reply to the client process. The data may be transferred, more commonly, as datagrams or a stream of characters (e.g., bytes).

Shared memory refers to the allocation of virtual memory space in order to substantiate a mechanism for which data may be communicated and/or accessed by multiple processes. In implementing shared memory, an initializing process first creates a shareable segment in persistent or non-persistent storage. Post creation, the initializing process then mounts the shareable segment, subsequently mapping the shareable segment into the address space associated with the initializing process. Following the mounting, the initializing process proceeds to identify and grant access permission to one or more authorized processes that may also write and read data to and from the shareable segment. Changes made to the data in the shareable segment by one process may immediately affect other processes, which are also linked to the shareable segment. Further, when one of the authorized processes accesses the shareable segment, the shareable segment maps to the address space of that authorized process. Often, only one authorized process may mount the shareable segment, other than the initializing process, at any given time.

Other techniques may be used to share data, such as the various data described in the present application, between processes without departing from the scope of the technology. The processes may be part of the same or different application and may execute on the same or different computing system.

Rather than or in addition to sharing data between processes, the computing system performing one or more embodiments of the technology may include functionality to receive data from a user. For example, in one or more embodiments, a user may submit data via a graphical user interface (GUI) on the user device. Data may be submitted via the graphical user interface by a user selecting one or more graphical user interface widgets or inserting text and other data into graphical user interface widgets using a touchpad, a keyboard, a mouse, or any other input device. In response to selecting a particular item, information regarding the particular item may be obtained from persistent or non-persistent storage by the computer processor. Upon selection of the item by the user, the contents of the obtained data regarding the particular item may be displayed on the user device in response to the user's selection.

By way of another example, a request to obtain data regarding the particular item may be sent to a server operatively connected to the user device through a network. For example, the user may select a uniform resource locator (URL) link within a web client of the user device, thereby initiating a Hypertext Transfer Protocol (HTTP) or other protocol request being sent to the network host associated with the URL. In response to the request, the server may extract the data regarding the particular selected item and send the data to the device that initiated the request. Once the user device has received the data regarding the particular item, the contents of the received data regarding the particular item may be displayed on the user device in response to the user's selection. Further to the above example, the data received from the server after selecting the URL link may provide a web page in Hyper Text Markup Language (HTML) that may be rendered by the web client and displayed on the user device.

Once data is obtained, such as by using techniques described above or from storage, the computing system, in performing one or more embodiments of the technology, may extract one or more data items from the obtained data. For example, the extraction may be performed as follows by the computing system in FIG. 5.1. First, the organizing pattern (e.g., grammar, schema, layout) of the data is determined, which may be based on one or more of the following: position (e.g., bit or column position, Nth token in a data stream, etc.), attribute (where the attribute is associated with one or more values), or a hierarchical/tree structure (consisting of layers of nodes at different levels of detail-such as in nested packet headers or nested document sections). Then, the raw, unprocessed stream of data symbols is parsed, in the context of the organizing pattern, into a stream (or layered structure) of tokens (where each token may have an associated token "type").

Next, extraction criteria are used to extract one or more data items from the token stream or structure, where the extraction criteria are processed according to the organizing pattern to extract one or more tokens (or nodes from a layered structure). For position-based data, the token(s) at the position(s) identified by the extraction criteria are extracted. For attribute/value-based data, the token(s) and/or node(s) associated with the attribute(s) satisfying the extraction criteria are extracted. For hierarchical/layered data, the token(s) associated with the node(s) matching the extraction criteria are extracted. The extraction criteria may be as simple as an identifier string or may be a query presented to a structured data repository (where the data repository may be organized according to a database schema or data format, such as XML).

The extracted data may be used for further processing by the computing system. For example, the computing system of FIG. 5.1, while performing one or more embodiments of the technology, may perform data comparison. Data comparison may be used to compare two or more data values (e.g., A, B). For example, one or more embodiments may determine whether A>B, A=B, A !=B, A<B, etc. The comparison may be performed by submitting A, B, and an opcode specifying an operation related to the comparison into an arithmetic logic unit (ALU) (i.e., circuitry that performs arithmetic and/or bitwise logical operations on the two data values). The ALU outputs the numerical result of the operation and/or one or more status flags related to the numerical result. For example, the status flags may indicate whether the numerical result is a positive number, a negative number, zero, etc. By selecting the proper opcode and then reading the numerical results and/or status flags, the comparison may be executed. For example, in order to determine if A>B, B may be subtracted from A (i.e., A−B), and the status flags may be read to determine if the result is positive (i.e., if A>B, then A−B>0). In one or more embodiments, B may be considered a threshold, and A is deemed to satisfy the threshold if A=B or if A>B, as determined using the ALU. In one or more embodiments of the technology, A and B may be vectors, and comparing A with B requires comparing the first element of vector A with the first element of vector B, the second element of vector A with the second element of vector B, etc. In one or more embodiments, if A and B are strings, the binary values of the strings may be compared.

The computing system in FIG. 5.1 may implement and/or be connected to a data repository. For example, one type of data repository is a database. A database is a collection of information configured for ease of data retrieval, modification, re-organization, and deletion. Database Management System (DBMS) is a software application that provides an interface for users to define, create, query, update, or administer databases.

The user, or software application, may submit a statement or query into the DBMS. Then the DBMS interprets the statement. The statement may be a select statement to request information, update statement, create statement, delete statement, etc. Moreover, the statement may include parameters that specify data, or data container (database, table, record, column, view, etc.), identifier(s), conditions (comparison operators), functions (e.g. join, full join, count, average, etc.), sort (e.g. ascending, descending), or others. The DBMS may execute the statement. For example, the DBMS may access a memory buffer, a reference or index a file for read, write, deletion, or any combination thereof, for responding to the statement. The DBMS may load the data from persistent or non-persistent storage and perform computations to respond to the query. The DBMS may return the result(s) to the user or software application.

The computing system of FIG. 5.1 may include functionality to present raw and/or processed data, such as results of comparisons and other processing. For example, presenting data may be accomplished through various presenting methods. Specifically, data may be presented through a user interface provided by a computing device. The user interface may include a GUI that displays information on a display device, such as a computer monitor or a touchscreen on a handheld computer device. The GUI may include various GUI widgets that organize what data is shown as well as how data is presented to a user. Furthermore, the GUI may present data directly to the user, e.g., data presented as actual data values through text, or rendered by the computing device into a visual representation of the data, such as through visualizing a data model.

For example, a GUI may first obtain a notification from a software application requesting that a particular data object be presented within the GUI. Next, the GUI may determine a data object type associated with the particular data object, e.g., by obtaining data from a data attribute within the data object that identifies the data object type. Then, the GUI may determine any rules designated for displaying that data object type, e.g., rules specified by a software framework for a data object class or according to any local parameters defined by the GUI for presenting that data object type. Finally, the GUI may obtain data values from the particular data object and render a visual representation of the data values within a display device according to the designated rules for that data object type.

Data may also be presented through various audio methods. In particular, data may be rendered into an audio format and presented as sound through one or more speakers operably connected to a computing device.

Data may also be presented to a user through haptic methods. For example, haptic methods may include vibrations or other physical signals generated by the computing system. For example, data may be presented to a user using a vibration generated by a handheld computer device with a predefined duration and intensity of the vibration to communicate the data.

The above description of functions presents only a few examples of functions performed by the computing system of FIG. 5.1 and the nodes and/or client device in FIG. 5.2. Other functions may be performed using one or more embodiments of the technology.

While one or more embodiments have been described with respect to a limited number of embodiments, those skilled in the art, having benefit of this disclosure, will appreciate that other embodiments may be devised which do not depart from the scope as disclosed herein. Accordingly, the scope should be limited by the attached claims.

What is claimed is:
1. A method comprising:
obtaining a collection of flow control device settings defined in continuous space;
performing, individually for each number of clusters of a plurality of numbers of clusters, a cluster analysis on the collection of flow control device settings to obtain a set of flow control device configurable positions comprising a number of flow control device configurable positions,
wherein performing the cluster analysis across the plurality of numbers of clusters generates a plurality of sets of flow control device configurable positions for the plurality of numbers of clusters;
comparing the plurality of sets of flow control device configurable positions via a processor executing instructions stored on tangible non-transitory storage to obtain a selected set of flow control device configurable positions;
presenting the selected set of flow control device configurable positions as a set of static positions of a flow control device to be manufactured and deployed; and
manufacturing the flow control device having the selected set of flow control device configurable positions, wherein the flow control device comprises at least one of a discrete flow control device, an inflow control device, or active inflow control devices.

2. The method of claim 1, further comprising:
executing a reservoir simulator on a reservoir model with the selected set of flow control device configurable positions to obtain a completion design; and
presenting the completion design,
wherein the completion design comprises a plurality of flow control device settings, each flow control device setting of the plurality of flow control device settings being in the selected set of flow control device configurable positions.

3. The method of claim 1, wherein the cluster analysis is performed for a plurality of dimensions of properties, the properties comprising at least one selected from a group consisting of fluid properties and flow properties.

4. The method of claim 1, further comprising:
for each number of clusters of the plurality of numbers of clusters,
determining a variance for the plurality of numbers of clusters in the set of flow control device configurable positions having the number of flow control device configurable positions based on the cluster analysis; and
associating the variance with the number of flow control device configurable positions to create a pair comprising the variance and the number of flow control device configurable positions;
defining a reference line connecting a first pair comprising a smallest number of the number of flow control device configurable positions to a second pair comprising a largest number of the number of flow control device configurable positions; and
selecting the set of the plurality of sets having a largest perpendicular distance to the reference line.

5. The method of claim 1,
wherein the cluster analysis for the number of flow control device configurable positions generates the number of clusters from the collection of flow control device settings, and wherein each cluster comprises a centroid corresponding to a flow control device configurable position of the set of flow control device configurable positions.

6. The method of claim 1, further comprising:
selecting an existing flow control device as the flow control device to be manufactured based on a difference between the flow control device configurable positions of the existing flow control device and the selected set of flow control device configurable positions.

7. A computer system comprising:
a computer processor;
memory coupled to the computer processor and storing instructions, which when executed on the computer processor, cause the computer processor to perform operations, the operations comprising:
obtaining a collection of flow control device settings defined in continuous space,
performing, individually for each number of clusters of a plurality of numbers of clusters, a cluster analysis on the collection of flow control device settings to obtain a set of flow control device configurable positions comprising a number of flow control device configurable positions,
wherein performing the cluster analysis across the plurality of numbers of clusters generates a plurality of sets of flow control device configurable positions for the plurality of numbers of clusters;
comparing the plurality of sets of flow control device configurable positions to obtain a selected set of flow control device configurable positions; and
presenting the selected set of flow control device configurable positions as a set of static positions of a flow control device to be manufactured and deployed; and
equipment for manufacturing the flow control device having the selected set of flow control device configurable positions, wherein the flow control device comprises at least one of a discrete flow control device, an inflow control device, or active inflow control devices.

8. The computer system of claim 7, wherein the operations further comprises:
executing a reservoir simulator on a reservoir model with the selected set of flow control device configurable positions to obtain a completion design; and
presenting the completion design,
wherein the completion design comprises a plurality of flow control device settings, each flow control device setting of the plurality of flow control device settings being in the selected set of flow control device configurable positions.

9. The computer system of claim 7, wherein the cluster analysis is performed for a plurality of dimensions of properties, the properties comprising at least one selected from a group consisting of fluid properties and flow properties.

10. The computer system of claim 7, wherein the operations further composes:
for each number of clusters of the plurality of numbers of clusters,
determining a variance for the plurality of numbers of clusters in the set of flow control device configurable positions having the number of flow control device configurable positions based on the cluster analysis; and
associating the variance with the number of flow control device configurable positions to create a pair comprising the variance and the number of flow control device configurable positions;
defining a reference line connecting a first pair comprising a smallest number of the number of flow control device configurable positions to a second pair comprising a largest number of the number of flow control device configurable positions; and
selecting the set of the plurality of sets having a largest perpendicular distance to the reference line.

11. The computer system of claim 7,
wherein the cluster analysis for the number of flow control device configurable positions generates the number of clusters from the collection of flow control device settings, and wherein each cluster comprises a centroid corresponding to a flow control device configurable position of the set of flow control device configurable positions.

12. The computer system of claim 7, wherein the operations further comprises:
selecting an existing flow control device as the flow control device to be manufactured based on a distance between the flow control device configurable positions of the existing flow control device and the selected set of flow control device configurable positions.

13. A computer program product comprising non-transitory computer-readable program code that, when executed by a computer processor of a computing system, cause the computing system to perform the method of claim 1.

* * * * *